United States Patent
Kim

(10) Patent No.: US 7,709,965 B2
(45) Date of Patent: May 4, 2010

(54) METAL LINE OF SEMICONDUCTOR DEVICE AND METHOD OF MANUFACTURING THE SAME

(75) Inventor: Seung Hyun Kim, Songpa-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 252 days.

(21) Appl. No.: 11/842,851

(22) Filed: Aug. 21, 2007

(65) Prior Publication Data
US 2008/0157371 A1    Jul. 3, 2008

(30) Foreign Application Priority Data
Dec. 27, 2006    (KR)    ........................ 10-2006-0135605

(51) Int. Cl.
H01L 23/52    (2006.01)
H01L 23/48    (2006.01)
H01L 29/40    (2006.01)

(52) U.S. Cl. .................. 257/774; 257/E23.145; 257/758; 257/775; 257/776; 438/653

(58) Field of Classification Search .......... 257/E21.476, 257/E23.01, E23.145, 751, 762, 764, 774–776, 257/753; 438/638, 653
See application file for complete search history.

(56) References Cited

U.S. PATENT DOCUMENTS

| | | | |
|---|---|---|---|
| 5,985,762 A * | 11/1999 | Geffken et al. ............... 438/687 |
| 6,358,842 B1 * | 3/2002 | Zhou et al. ................... 438/633 |
| 6,498,091 B1 * | 12/2002 | Chen et al. ................... 438/627 |
| 6,586,334 B2 | 7/2003 | Jiang |
| 6,590,288 B1 * | 7/2003 | Woo et al. .................... 257/751 |
| 6,624,066 B2 * | 9/2003 | Lu et al. ...................... 438/643 |
| 6,756,672 B1 * | 6/2004 | You et al. .................... 257/751 |
| 6,812,133 B2 * | 11/2004 | Takeuchi .................... 438/623 |
| 6,987,059 B1 * | 1/2006 | Burke et al. ................. 438/627 |
| 7,026,238 B2 * | 4/2006 | Xi et al. ...................... 438/625 |
| 2002/0155700 A1 * | 10/2002 | Chen et al. ................... 438/639 |
| 2003/0075752 A1 * | 4/2003 | Motoyama ................... 257/306 |
| 2004/0063310 A1 * | 4/2004 | Ngo et al. .................... 438/637 |

* cited by examiner

*Primary Examiner*—Chris C Chu
(74) *Attorney, Agent, or Firm*—Saliwanchik, Lloyd & Saliwanchik

(57) ABSTRACT

Disclosed are a metal line of a semiconductor device and a method of manufacturing the same. In one embodiment, the metal line includes a first interlayer dielectric layer pattern formed on a lower interconnection structure and having a via hole that exposes a lower interconnection of the lower interconnection structure, a first barrier pattern selectively covering a sidewall of the via hole and the lower interconnection, a second interlayer dielectric layer pattern on the first interlayer dielectric layer pattern and having a trench that exposes the via hole, a second barrier pattern covering an inner wall of the trench and the first barrier pattern, a seed pattern formed on the second barrier pattern, and a copper line formed on the seed pattern.

3 Claims, 5 Drawing Sheets

METAL LINE OF SEMICONDUCTOR DEVICE AND METHOD OF MANUFACTURING THE SAME

CROSS-REFERENCE TO RELATED APPLICATION

The present application claims the benefit under 35 U.S.C. §119 of Korean Patent Application No. 10-2006-0135605, filed Dec. 27, 2006, which is hereby incorporated by reference in its entirety.

BACKGROUND

Semiconductor devices have become highly integrated and are operated at a high speed. Accordingly, the size of a transistor has become gradually reduced. As the integration degree of a transistor increases, a metal line of a semiconductor device is fabricated in a micro size. As a result, signals applied to the metal line are delayed or distorted due to parasitic resistance and capacitance and thus the high-speed operation of the semiconductor device is interrupted.

In order to solve such a problem, a copper line using copper has been rapidly developed because the copper line has lower resistance and higher electro-migration as compared to aluminum or aluminum alloy that was widely used as metal line material of a semiconductor device.

In order to form a copper line, a copper layer is formed and then must be etched. However, copper is not as easily etched as aluminum, and the surface of a copper layer is rapidly oxidized in the air. Accordingly, a damascene process has been developed in order to solve such a problem when forming a copper line.

According to the damascene process, via holes and trenches are formed in an interlayer dielectric layer, a copper layer is deposited on the interlayer dielectric layer such that the via holes and trenches are filled with the copper layer, and the copper layer is planarized through a Chemical Mechanical Polishing (CMP) process, so that copper lines are formed in the via holes and trenches.

Copper ions contained in the copper lines are easily diffused to the interlayer dielectric layer and may cause a short circuit with respect to adjacent metal lines. Accordingly, via holes and trenches are formed in the interlayer dielectric layer, and then barrier layers are formed on the inner walls of the via holes and trenches in order to prevent copper ions from being diffused.

However, since the barrier layers formed on the inner walls of the via holes and trenches have an inferior step coverage, undesired voids may be produced when the copper lines are formed on the inner walls of the via holes and trenches. In particular, voids may form due to the sputtering process of a thin barrier metal layer.

BRIEF SUMMARY

Embodiments of the present invention provide a metal line of a semiconductor device in which voids can be inhibited from being produced when a copper line is formed. Accordingly, step coverage of a barrier layer is provided.

According to one embodiment, a metal line of a semiconductor device includes a first interlayer dielectric layer pattern formed on a lower interconnection structure and having a via hole that exposes a lower interconnection of the lower interconnection structure; a first barrier pattern for selectively covering a sidewall of the via hole and the lower interconnection; a second interlayer dielectric layer pattern covering the first interlayer dielectric layer pattern and having a trench exposing the via hole; a second barrier pattern covering an inner wall of the trench and the first barrier pattern; a seed pattern formed on the second barrier pattern; and a copper line formed on the seed pattern.

According to another embodiment, a metal line of a semiconductor device includes a first interlayer dielectric layer formed on a lower interconnection structure and having a via hole that exposes a lower interconnection of the lower interconnection structure; a second interlayer dielectric layer pattern on the first interlayer dielectric layer pattern and having a trench exposing the via hole; a first barrier layer pattern selectively covering sidewalls of the via hole and the trench; a second barrier layer pattern formed in the via hole and the trench and covering the first barrier pattern; a seed pattern formed on the second barrier pattern; and a copper line formed on the seed pattern.

A method for manufacturing a metal line of a semiconductor device according to an embodiment of the present invention includes forming a first interlayer dielectric layer covering a lower interconnection structure; forming a second interlayer dielectric layer covering the first interlayer dielectric layer; forming a via hole and a trench exposing a lower interconnection of the lower interconnection structure by patterning the first and second interlayer dielectric layers; forming a first barrier layer covering the via hole and the trench; forming a first barrier pattern from the first barrier layer on the lower interconnection and a portion of a sidewall of the via hole; forming a second barrier pattern covering an inner wall of the trench and the first barrier pattern; forming a seed pattern on the second barrier pattern; and forming a copper line on the seed pattern.

In addition, a method for manufacturing a metal line of a semiconductor device according to another embodiment includes: forming a first interlayer dielectric layer covering a lower interconnection structure; forming a second interlayer dielectric layer covering the first interlayer dielectric layer; forming a via hole and a trench exposing a lower interconnection of the lower interconnection structure by patterning the first and second interlayer dielectric layers; forming a first barrier layer covering the via hole and the trench; forming a first barrier layer pattern selectively formed at sidewalls of the via hole and the trench by performing a blanket etching process for the first barrier layer; forming a second barrier layer pattern covering the first barrier pattern in the via hole and the trench; forming a seed pattern on the second barrier layer pattern; and forming a copper line on the seed pattern.

DETAILED DESCRIPTION

Figure 1:
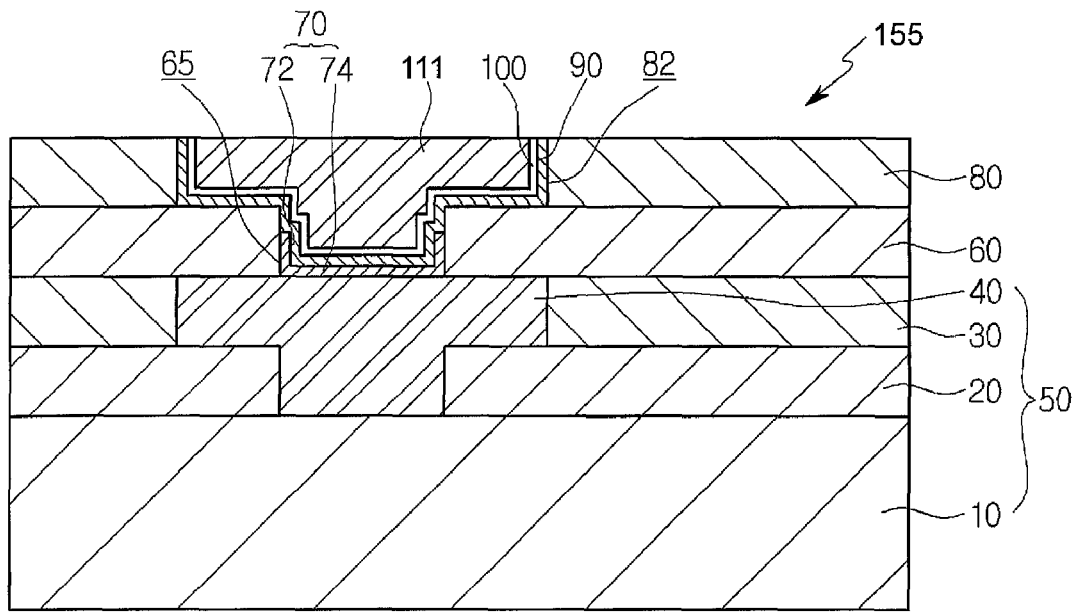
FIG. 1 is a cross-sectional view illustrating a metal line of a semiconductor device according to an embodiment of the present invention.

FIG. 1 is a cross-sectional view illustrating a metal line of a semiconductor device according to one embodiment.

Referring to FIG. 1, a metal line 155 of a semiconductor device can include a lower interconnection structure 50, a first interlayer dielectric layer pattern 60, a first barrier pattern 70, a second interlayer dielectric layer pattern 80, a second barrier pattern 90, a seed pattern 100, and a copper line 111.

In one embodiment the lower interconnection structure 50 includes interlayer dielectric layers 20 and 30 and a lower interconnection 40, but embodiments are not limited thereto. The lower interconnection 40 and interlayer dielectric layer 20 can be formed on a substrate 10 including various device structures.

The first interlayer dielectric layer pattern 60 is arranged on the lower interconnection structure 50, and the second interlayer dielectric layer pattern 80 is arranged on the first interlayer dielectric layer pattern. The first interlayer dielectric layer pattern 60 has a via hole 65, and the via hole 65 exposes the lower interconnection 40 of the lower interconnection structure 50.

The first barrier pattern 70 is arranged in the via hole 65 on the sidewall of the via hole 65 and the lower interconnection 40 exposed through the via hole 65. The portion of the first barrier pattern 70 arranged on the sidewall of the via hole 65 will be defined as a first pattern 72, and the first barrier pattern 70 arranged on the lower interconnection 40 will be defined as a second pattern 74. According to embodiments, the first barrier pattern 70 can be formed of material such as TaN, Ta, Ti, TiN and TiSiN.

In this embodiment, the first pattern 72 of the first barrier pattern 70 has a height lower than the first interlayer dielectric layer pattern 60. This reduced height of the first pattern 72 is used to inhibit voids from being produced in the copper line 111.

The second interlayer dielectric layer pattern 80 has a trench 82 exposing the via hole 65 and the first barrier pattern 70. The trench 82 has an area larger than a surface area of the via hole 65.

The second barrier pattern 90 covers the inner wall of the trench 82, the inner wall of the via hole 65, and the first barrier pattern 70. Since the first barrier pattern 70 overlaps with the second barrier pattern 90 on a bottom surface of the via hole 65, the second barrier pattern 90 has a stable structure on the bottom surface of the via hole 65. Therefore, voids can be inhibited from being produced in the process of forming the copper line. According to embodiments, the second barrier pattern 90 can be formed of material such as TaN, Ta, Ti, TiN and TiSiN.

The seed pattern 100 is formed on the second barrier pattern 90 and the copper line 111 is arranged on the seed pattern 100 thereby resulting in a metal line according to this embodiment.

FIGS. 2 to 5 are cross-sectional views illustrating a method for manufacturing the metal line of the semiconductor device shown in FIG. 1 according to an embodiment of the present invention.

Figure 2:
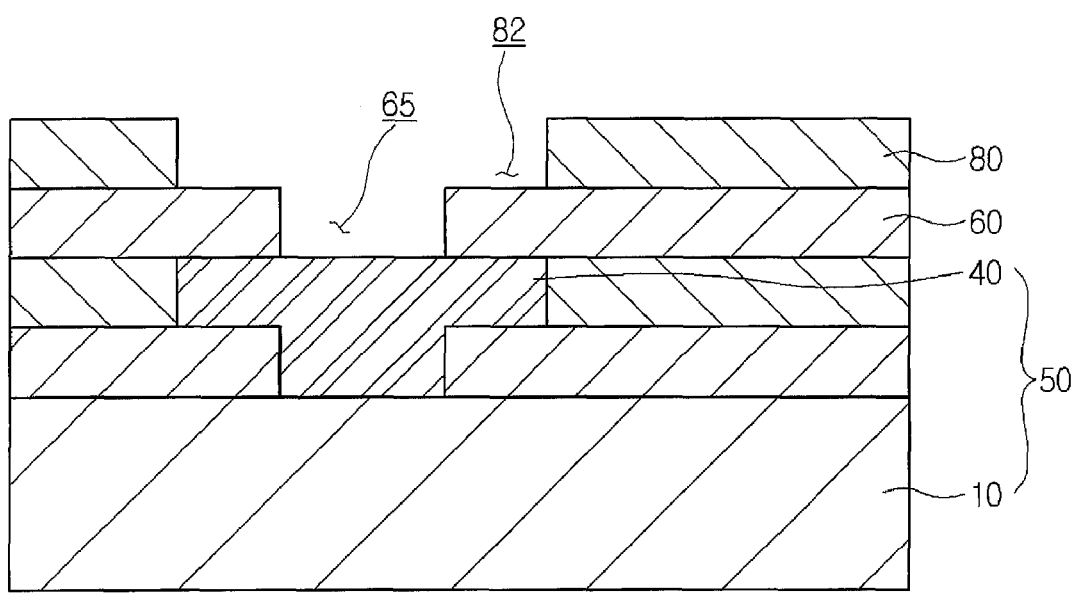
FIGS. 2 to 5 are cross-sectional views illustrating a method for manufacturing the metal line of the semiconductor device shown in FIG. 1 according to an embodiment of the present invention.

Referring to FIG. 2, a first interlayer dielectric layer pattern 60 having a via hole 65 and a second interlayer dielectric layer pattern 80 having a trench 82 can be formed on a lower interconnection structure 50. The lower interconnection structure 50 can be, for example, a lower metal interconnection 40 formed on a substrate 10.

According to some embodiments, the first and second interlayer dielectric layer patterns 60 and 80 can be formed, for example, by depositing a first interlayer dielectric layer, optionally depositing an etch stop layer (not shown), depositing a second interlayer dielectric layer, forming a photoresist pattern for a via hole, etching the second and first interlayer dielectric layers using the photoresist pattern to form a via hole above the lower metal interconnection 40, forming a second photoresist pattern for a trench, and etching the second interlayer dielectric layer using the second photoresist pattern to form a trench 82 above the via hole in the first interlayer dielectric layer.

Figure 3:
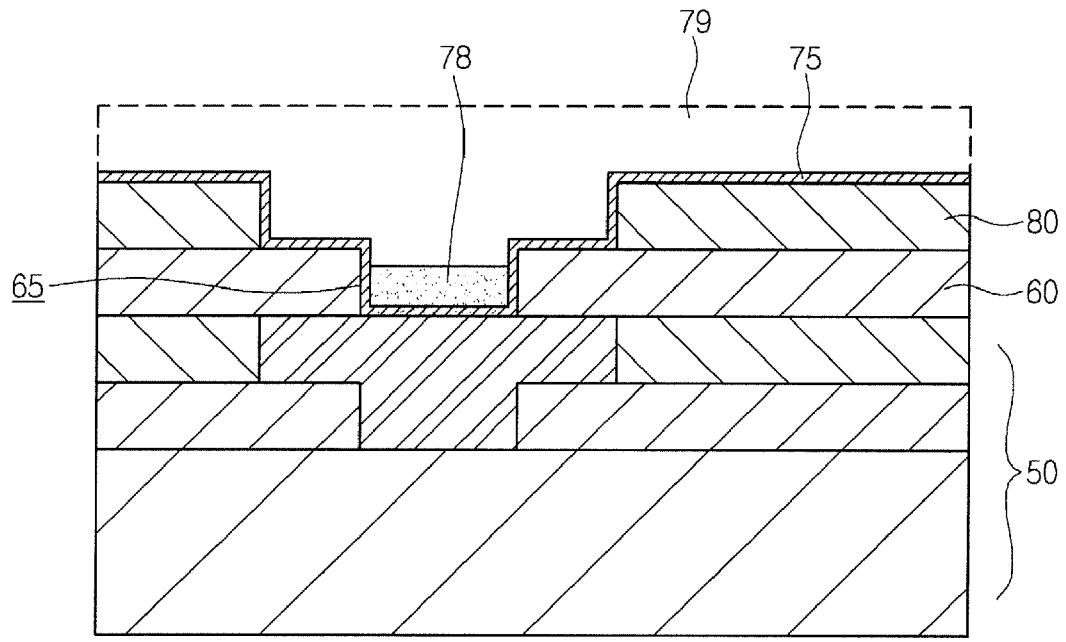

Referring to FIG. 3, a first barrier layer 75 is formed on the second interlayer dielectric layer pattern 80 and in the trench 82 and the via hole 65. In the embodiment, the first barrier layer 75 can use material such as, for example, TaN, Ta, Ti, TiN and TiSiN.

Then, a resin pattern 78 is formed on the first barrier layer 75.

In order to form the resin pattern 78, a resin layer 79 is formed on the entire surface of the first barrier layer 75. In one embodiment, the resin layer 79 can include Novalac resin and completely covers the first barrier layer 75.

The resin layer 79 is formed and then is etched back, so that the resin pattern 78 is formed. According to embodiments, the resin pattern 78 has a thickness smaller than the height of the via hole 65.

Figure 4:
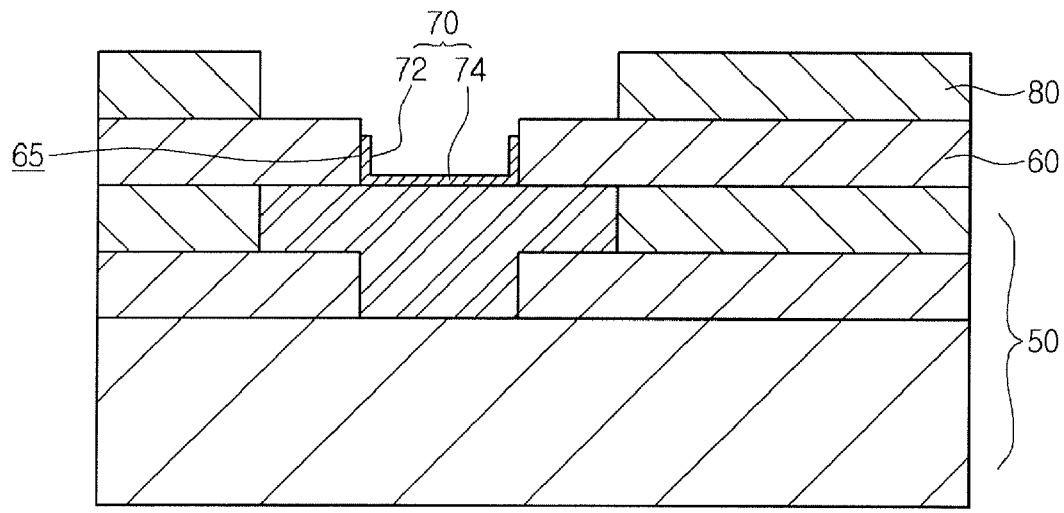

Referring to FIG. 4, the resin pattern 78 is formed in the via hole 65, and then the first barrier layer 75 is patterned using the resin pattern 78 as an etching mask, so that the first barrier pattern 70 is formed in the via hole 65. The first barrier layer 75 can be subjected to a wet etching process using, for example, $HNO_3/HF$ solution or a dry etching process using, for example, plasma.

The first barrier pattern 70 formed by patterning the first barrier layer 75 includes first pattern 72 and second pattern 74. The first pattern 72 is formed on the sidewall of the via hole 65 and the second pattern 74 makes electrical contact with the upper surface of the lower metal interconnection 40. The first pattern 72 has a height determined by the resin pattern 78.

According to this embodiment, since the resin pattern 78 has a thickness smaller than the height of the via hole 65, the first pattern 72 also has a height smaller than the height of the via hole 65.

Figure 5:
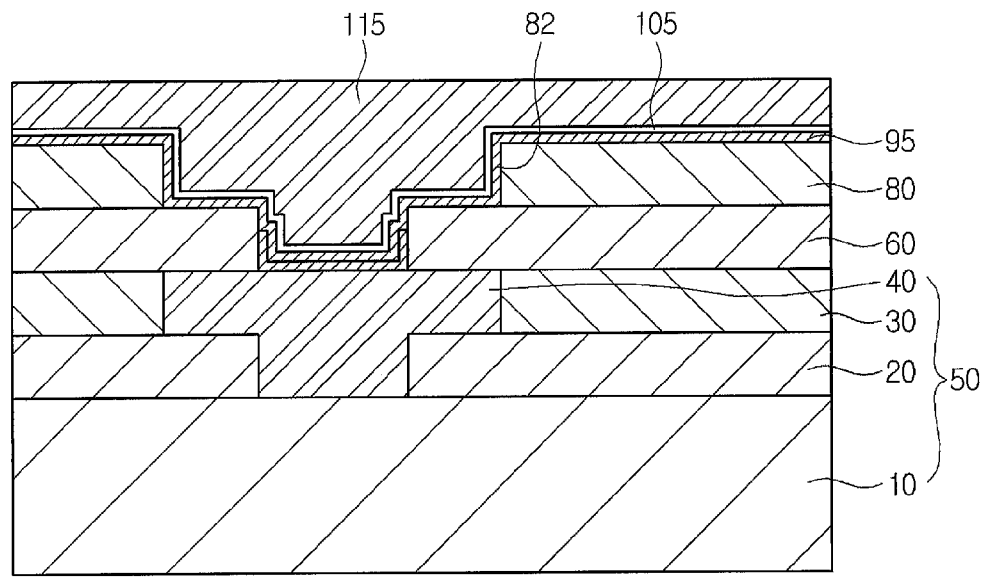

Referring to FIG. 5, a second barrier layer 95 is formed on the second interlayer dielectric layer pattern 80 and the first barrier pattern 70. The second barrier layer 95 can be formed of material such as TaN, Ta, Ti, TiN and TiSiN.

After the second barrier layer 95 is formed, a seed layer 105 can be formed on the second barrier layer 95. In one embodiment, the seed layer 105 can use material such as copper.

After the second barrier layer 95 and the seed layer 105 are formed, a copper layer 115 can be formed on the seed layer 105.

According to an embodiment, since the second barrier layer 95 overlaps with the first barrier pattern 70 on the bottom surface of the via hole 65 of the first interlayer dielectric layer pattern 60, voids can be inhibited from being produced in the via hole 65 when the copper layer 115 is formed.

Then, the copper layer 115, the seed layer 105 and the second barrier layer 95 formed on the upper surface of the second interlayer dielectric layer pattern 80 are removed through a CMP process, so that the copper line 111, the seed pattern 100 and the second barrier layer pattern 90 are formed as shown in FIG. 1.

Figure 6:
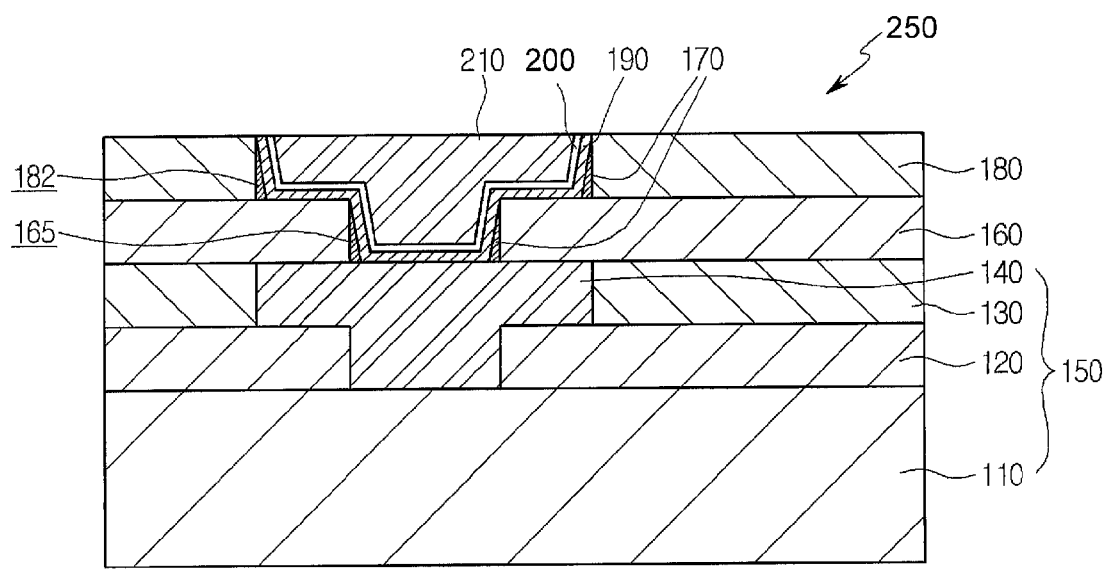
FIG. 6 is a cross-sectional view illustrating a metal line of a semiconductor device according to an embodiment of the present invention.

FIG. 6 is a cross-sectional view illustrating a metal line of a semiconductor device according to another embodiment.

Referring to FIG. 6, a metal line 250 of a semiconductor device can include a lower interconnection structure 150, a first interlayer dielectric layer pattern 160, a first barrier pattern 170, a second interlayer dielectric layer pattern 180, a second barrier pattern 190, a seed pattern 200 and a copper line 210.

In one embodiment, the lower interconnection structure 150 includes interlayer dielectric layers 120 and 130 and a lower interconnection 140, but embodiments are not limited thereto. The lower interconnection 140 and interlayer dielectric layer 120 can be formed on a substrate 110 including various device structures.

The first interlayer dielectric layer pattern 160 is arranged on the lower interconnection structure 150, and the second interlayer dielectric pattern 180 is arranged on the first interlayer dielectric pattern 160. The first interlayer dielectric layer pattern 160 has a via hole 165, and the via hole 165 exposes the lower interconnection 140 of the lower interconnection structure 150. In addition, the second interlayer dielectric layer pattern 180 has a trench 182 exposing the via hole 165.

The first barrier pattern 170 is formed on the sidewalls of the via hole 165 formed on the first interlayer dielectric layer pattern 160 and on the sidewalls of the trench 182 formed on the second interlayer dielectric layer pattern 180. Sections of the first barrier pattern 170 selectively formed on the sidewalls of the via hole 165 and the trench 182 have a variable thickness that gradually increases in the downward direction thereof. The first barrier pattern 170 can be formed of material such as, for example, TaN, Ta, Ti, TiN, SiN, and TiSiN.

The angled sidewall sections of the first barrier pattern 170 have a variable thickness that gradually increases in the downward direction thereof, so that voids can be inhibited from being produced in the copper line 210.

The second barrier pattern 190 covers the inner wall of the trench 182, the inner wall of the via hole 165, the first barrier pattern 170 and the lower interconnection 140. Since the first barrier pattern 170 is selectively arranged on only the sidewalls of the via hole 165 and the trench 182, the second barrier pattern 190 has a stable structure on the bottom surface of the via hole 165, and thus voids can be inhibited from being produced in the process of forming the copper line. According to embodiments, the second barrier pattern 190 can use material such as TaN, Ta, Ti, TiN and TiSiN.

The seed pattern 200 is formed on the second barrier pattern 190, and the copper line 210 is arranged on the seed pattern 200, thereby resulting in a metal line according to this embodiment.

Figure 7:
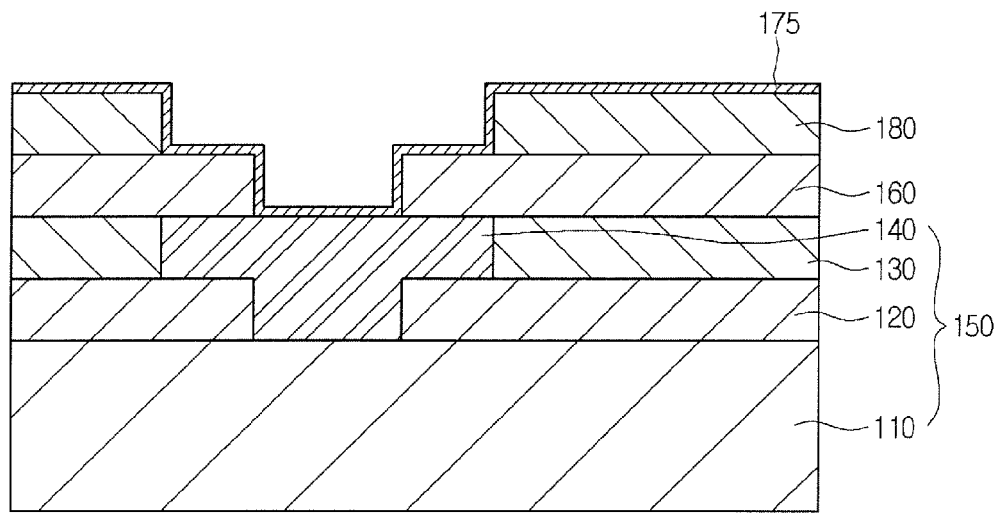
FIGS. 7 to 9 are cross-sectional views illustrating a method for manufacturing the metal line of the semiconductor device shown in FIG. 6 according to an embodiment of the present invention.
Figure 8:
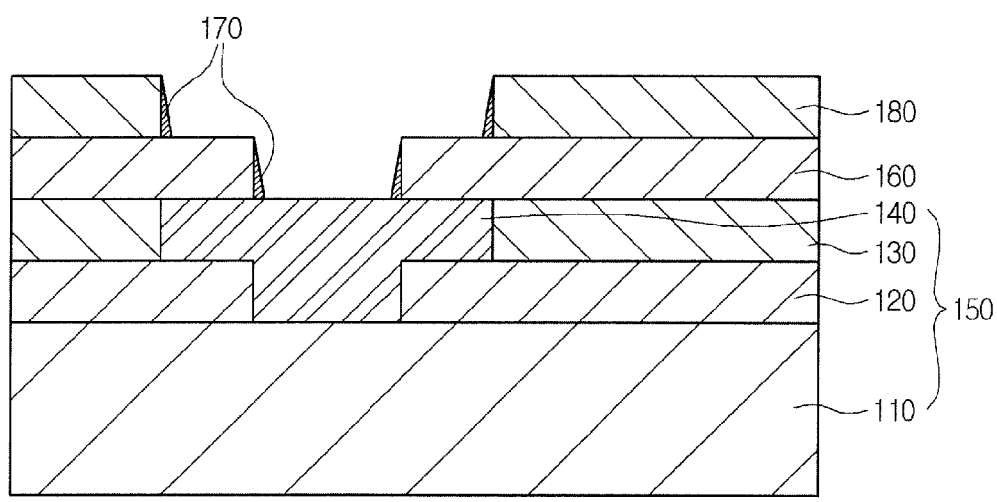
Figure 9:
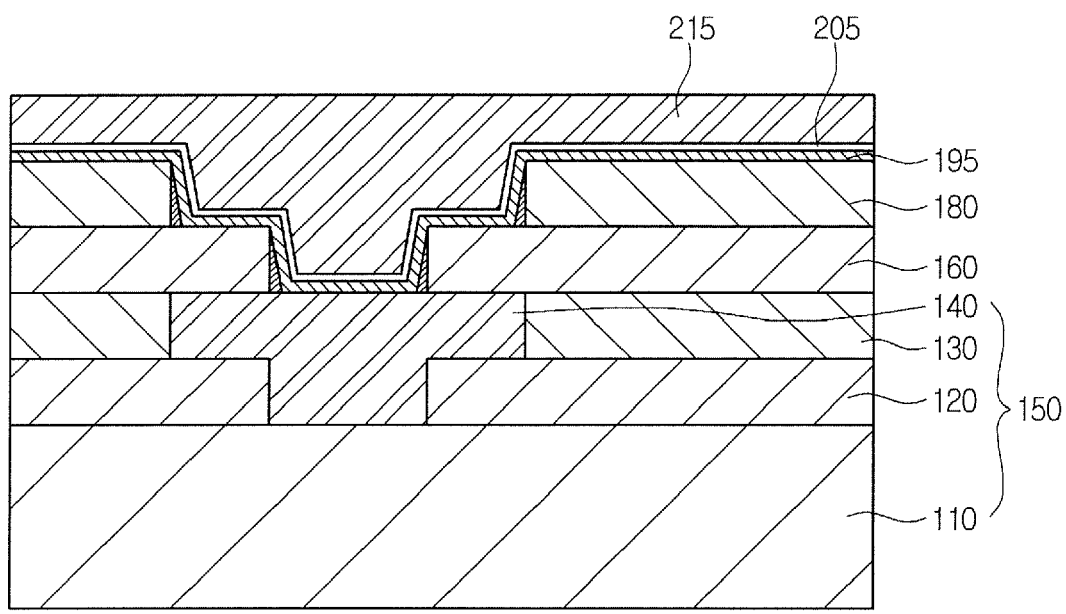

FIGS. 7 to 9 are sectional views illustrating a method for manufacturing the metal line of the semiconductor device shown in FIG. 6 according to an embodiment of the present invention.

Referring to FIG. 7, a lower interconnection structure 150 having a lower interconnection 140 can be formed on a semiconductor substrate 110.

Then a first interlayer dielectric layer pattern 160 having a via hole 165 and a second interlayer dielectric layer pattern 180 having a trench 182 are formed on the lower interconnection structure 150.

In one embodiment, the first and second interlayer dielectric layer patterns 160 and 180 can be formed by depositing a first interlayer dielectric layer (not shown) and a second interlayer dielectric layer (not shown), and then forming the via hole 165 and the trench 182. The via hole 165 and trench 182 can be formed by a typical damascene process.

After the first interlayer dielectric layer pattern 160 having the via hole 165 and the second interlayer dielectric layer pattern 180 having the trench 182 are formed, a first barrier layer 175 can be formed on the second interlayer dielectric layer pattern 180. The first barrier layer 175 can be formed of material such as TaN, Ta, Ti, TiN, SiN, and TiSiN.

Referring to FIG. 8, the first barrier layer 175 is subjected to a blanket etching process, so that a first barrier layer pattern 170 is selectively formed on the sides of the via hole 165 and the trench 182.

Referring to FIG. 9, a second barrier layer 195 is formed on the second interlayer dielectric layer pattern 180 including in the trench 182 and via hole 165, and on the first barrier layer pattern 170. The second barrier layer 195 can be formed of material such as TaN, Ta, Ti, TiN and TiSiN.

After the second barrier layer 195 is formed, a seed layer 205 can be formed on the second barrier layer 195. In one embodiment, the seed layer 205 can include material such as copper.

Then, a copper layer 215 can be formed on the seed layer 205.

Since the second barrier layer 195 overlaps with the first barrier pattern 170 arranged on the sidewalls of the via hole 165 of the first interlayer dielectric layer pattern 160 and the sidewalls of the trench 182 of the second interlayer dielectric layer pattern 180, voids can be inhibited from being produced in the via hole 165 and the trench 182 when the copper layer 215 is formed.

The copper layer 215, the seed layer 205, and the second barrier layer 195 formed on the upper surface of the second interlayer dielectric layer pattern 180 are removed through a CMP process, so that the copper line 210, the seed pattern 200 and the second barrier layer pattern 190 are formed as shown in FIG. 6.

According to the embodiments as described above, the shape and structure of a barrier layer are improved, so that voids can be inhibited from being produced when a copper line is being formed.

Although not illustrated in the drawings, the lower metal interconnection and other layers of metal interconnections can be formed utilizing the described shapes and structure of a barrier layer.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A metal line of a semiconductor device, comprising:

a first interlayer dielectric layer pattern formed on a lower interconnection and having a via hole exposing the lower interconnection;

a first barrier pattern selectively provided at a portion of the via hole;

a second interlayer dielectric layer pattern on the first interlayer dielectric layer pattern and having a trench above the via hole;

a second barrier pattern in the trench and via hole, the second barrier pattern covering the first barrier pattern;

a seed pattern formed on the second barrier pattern; and a copper line formed on the seed pattern, wherein the first barrier pattern selectively covers a sidewall of the via hole and the exposed lower interconnection, wherein a bottom surface of the first barrier pattern covers the exposed lower interconnection, and a height of a side of the first barrier pattern formed on the sidewall of the via hole is lower than the thickness of the first interlayer dielectric layer.

2. The metal line according to claim 1, wherein the first barrier pattern comprises one selected from the group consisting of TaN, Ta, Ti, TiN and TiSiN.

3. The metal line according to claim 1, wherein the height of the side of the first barrier pattern formed on the sidewall of the via hole is lower than the height of the via hole.

* * * * *